United States Patent Office 3,711,324

Patented Jan. 16, 1973

3,711,324

METHOD OF FORMING A DIFFUSION MASK BARRIER ON A SILICON SUBSTRATE

William B. Glendinning, Belford, and Wellington B. Pharo, Neptune, N.J., assignors to the United States of America as represented by the Secretary of the Army No Drawing. Filed Mar. 16, 1971, Ser. No. 124,915
Int. Cl. B44d *1/00, 1/18*
U.S. Cl. 117—201 2 Claims

ABSTRACT OF THE DISCLOSURE

A diffusion mask barrier is formed on a silicon substrate having a particular impurity profile by exposing the substrate surface to a chemical vapor environment of nitric oxide, hydrogen fluoride and water at about 35 degrees C., and for about 3 to 5 minutes to obtain an adherent film of about 1000 to about 3000 angstroms in thickness.

This invention relates to a method of forming a diffusion mask barrier on a silicon substrate having a particular impurity profile.

BACKGROUND OF THE INVENTION

Heretofore, standard silicon device manufacture has involved the use of a high temperature thermal oxidation process in fabricating diffusion masks on silicon substrates. Such processes generally involve the use of temperatures in the range of 900 to 1200 degrees C. The above technique is satisfactory when processing non-diffused and nonepitaxial homogeneous silicon substrates. However, if the silicon substrate bears an impurity profile such as a p, $p^+$, n, or $n^+$ type conductivity, or combinations thereof, the high temperature thermal oxidation process is not entirely satisfactory. This is because the elevated temperatures involved have the effect of causing migration of the original impurity profile resulting in unsatisfactory process control. Lack of proper process controls in turn results in diodes and/or transistors characterized by inadequate electrical characteristics.

SUMMARY OF THE INVENTION

The general object of this invention is to provide a method of forming a diffusion mask barrier on a silicon substrate having a particular impurity profile. A further object of the invention is to provide such a method wherein the resulting silicon substrate can be used in the manufacture of diodes and/or transistors characterized by adequate electrical characteristics.

According to the invention, a diffusion mask barrier is formed on a silicon substrate by exposing the top surface of the silicon substrate in a closed chamber at about 35 degrees C., and for about 3 to 5 minutes to a chemical vapor environment of nitric oxide, hydrogen fluoride and water to obtain an adherent complex oxide film of about 1000 to about 3000 angstroms in thickness. The silicon substrate bearing the diffusion impurity mask barrier or film can then be fabricated into a silicon device using conventional photolithographic techniques.

BRIEF DESCRIPTION OF THE PREFERRED EMBODIMENT

A $p^+$ type silicon wafer with a p type epitaxial layer or impurity profile is placed in a suitable closed chamber such as a plastic bell jar and the chamber purged with an inert gas such as argon. The wafer is then exposed to a chemical vapor pressure environment of 1 atmosphere consisting of about 30 to 60 millimeters mercury of nitric oxide, 8 to 10 millimeters mercury of hydrogen fluoride, and 3 to 4 millimeters mercury of water and inert carrier gas (argon) for about 3 to 5 minutes at about 35 degrees C. (±1 degree C.). The resulting adhering complex oxide film is about 1000 to 3000 angstroms in thickness and is suitable as a diffusion impurity mask barrier in the subsequent fabrication of a silicon device using conventional photolithographic techniques.

Such conventional techniques which form no part of this invention include the making of openings or windows in the diffusion-mask film using standard positive or negative photoresist followed by impurity diffusion using conventional techniques. For example, in the above embodiment, an N type diffused layer can be placed in the p type epitaxial layer by sublimation of a phosphorous pentoxide source in a slightly oxidizing nitrogen stream. The phosphorous impurity diffuses into the unmasked windows upon exposure at temperatures of 900 degrees C. In less than an hour, an erfc type impurity diffusion is created in the silicon having an impurity surface concentration of greater than ($10^{19}$) atom per $cm.^3$. An NP junction is thus placed at depths below the silicon surface ranging to 0.7 micron. Inversion of the silicon surface at locations beneath the mask does not occur at all. Conventional device finishing methods may be applied to provide metal electrical contacts to N and P regions of the diffused diodes. For monolithic silicon integrated circuit applications, interconnections may be made across the mask film material which acts as an excellent electrical insulator.

The invention is simple in the type of equipment and materials required. That is, the silicon wafer or substrate is placed on an inert Teflon type base or other suitable mounting in the closed chamber so that the top surface of the wafer is exposed to the chemical vapor environment. The time required for exposure is about 3 to 5 minutes. The temperature during exposure is maintained at 35 degree C.±1 degree C. The low temperature of growth reduces the mechanical strain effects due to diffusion mask-silicon thermal coefficient of expansion differences. The short diffusion mask fabrication time is about one fifth the time required for fabricating a diffusion mask by the conventional high temperature thermal oxidation technique. Moreover, the mechanical stress of the diffusion mask barrier is reduced from 50,000 pounds per square inch as in the case of the barrier as made by conventional high temperature thermal oxidation to 20,000 pounds per square inch in the case of the barrier or film made by the low temperature method of this invention. Moreover, this low temperature method completely eliminates the impurity atom diffusion effects inherent in conventional oxide or other elevated temperature fabrication methods. Then too, the method of this invention enables the use of simple film growth process apparatus. In this connection, conventional high temperature thermal oxide apparatus costs about $5,000 as compared to the apparatus used in the instant invention which is about $2,000.

We wish it to be understood that we do not desire to be limited to the exact details of construction shown and described, for obvious modifications will occur to a person skilled in the art.

What is claimed is:

1. Method of forming a diffusion mask barrier on a silicon substrate having a particular impurity profile, said method comprising exposing the top surface of the silicon substrate in a closed chamber at about 35 degrees C. and for about 3 to 5 minutes to a chemical vapor environment of nitric oxide, hydrogen fluoride, and water to obtain an adherent film of about 1000 to about 3000 angstroms in thickness having a mechanical stress of about 20,000 pounds per square inch.

2. The method according to claim 1 wherein the chemical vapor environment is about 30 to 60 millimeters mercury of nitric oxide, about 8 to 10 millimeters mercury of hydrogen fluoride, about 3 to 4 millimeters mercury of water, and up to 1 atmosphere of inert gas.

References Cited

UNITED STATES PATENTS

| | | | |
|---|---|---|---|
| 3,287,162 | 11/1966 | Chu et al. | 117—230 |
| 3,396,052 | 8/1968 | Rane et al. | 117—201 |
| 3,625,749 | 12/1971 | Yoshioka et al. | 117—201 X |
| 3,442,700 | 5/1969 | Yoshioka et al. | 117—201 |

ALFRED L. LEAVITT, Primary Examiner

K. P. GLYNN, Assistant Examiner

U.S. Cl. X.R.

117—106 R, 212